United States Patent
Chester

[19]

[11] Patent Number: 6,014,055

[45] Date of Patent: Jan. 11, 2000

[54] CLASS D AMPLIFIER WITH REDUCED CLOCK REQUIREMENT AND RELATED METHODS

[75] Inventor: David B. Chester, Palm Bay, Fla.

[73] Assignee: Intersil Corporation, Palm Bay, Fla.

[21] Appl. No.: 09/020,178

[22] Filed: Feb. 6, 1998

[51] Int. Cl.[7] ....................................................... H03F 3/38
[52] U.S. Cl. ............................................. 330/10; 330/251
[58] Field of Search ................................. 330/10, 207 A, 330/251; 341/152, 53; 375/242, 238, 241; 340/347 DA

[56] References Cited

U.S. PATENT DOCUMENTS

| | | | |
|---|---|---|---|
| 3,789,393 | 1/1974 | Tripp | 340/347 DA |
| 3,893,102 | 7/1975 | Candy | 340/347 DA |
| 4,006,475 | 2/1977 | Candy et al. | 340/347 DA |
| 4,390,849 | 6/1983 | Miskin | 330/251 |
| 4,590,457 | 5/1986 | Amir | 340/347 DA |
| 4,673,887 | 6/1987 | Atherton | 330/10 |

*Primary Examiner*—Robert Pascal
*Assistant Examiner*—Henry Choe

*Attorney, Agent, or Firm*—Allen, Dyer, Doppelt, Milbrath & Gilchrist, P.A.

[57] ABSTRACT

A class D amplifier includes a separating circuit for separating a pulse code modulation (PCM) signal into a K least significant bits (LSBs) signal and an L most significant bits (MSBs) signal; a PCM to pulse width modulation (PWM) converter for converting the L MSBs signal into a PWM signal; and an LSB processor for proportionally altering the PWM signal from the PCM to PWM converter based upon the K LSBs signal to define a PWM output control signal. More particularly, the PCM input signal may be an N−1 bit PCM magnitude signal. The amplifier preferably further includes a sign and magnitude extraction circuit for extracting a sign bit signal and the N−1 bit magnitude signal from an N bit two's complement PCM input signal. Accordingly, the class D amplifier may also include a switch driver responsive to the extracted sign bit signal and the PWM output control signal, such as to control polarity and on time, respectively. The PCM to PWM converter may be one of a symmetric PCM to PWM converter; a trailing edge PCM to PWM converter; and a leading edge PCM to PWM converter. Thus, the LSB processor circuit is preferably adapted for cooperating with the respective type of PCM to PWM converter.

35 Claims, 6 Drawing Sheets

CLASS D AMPLIFIER WITH REDUCED CLOCK REQUIREMENT AND RELATED METHODS

FIELD OF THE INVENTION

The invention relates to the field of electronic circuits and devices, and, more particularly, to a class D amplifier and related methods.

BACKGROUND OF THE INVENTION

Amplifiers are widely used in many electronic devices to increase the input signal level to a desired output level. A class D amplifier includes an active device used as an on-off switch, and output power variations are achieved by pulse-width modulation. Class D amplifiers may be used in radio broadcast transmitters, and audio amplifiers, for example. The very high switching efficiency of power metal-oxide field-effect transistors (MOSFETs), for example, permits their use in class D audio amplifiers to produce high fidelity signals with relatively compact and efficient circuits.

Figure 1:
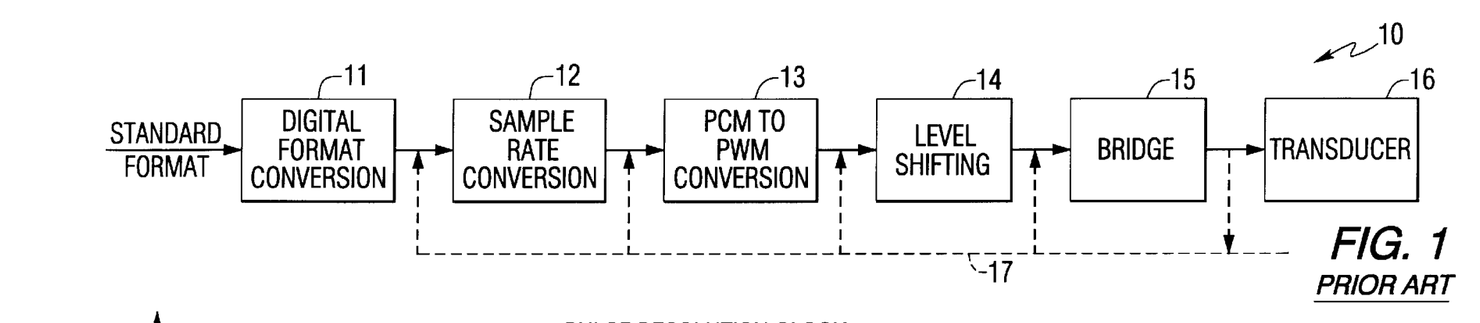
FIG. 1 is a schematic block diagram of a class D amplifier according to the prior art.

A typical digital input class D amplifier 10 is shown in FIG. 1. The amplifier 10 includes a digital format converter 11 which receives the input signal in a standard format. A sample rate converter 12 converts the output of the digital format converter for input to the pulse code modulation (PCM) to pulse width modulation (PWM) converter 13. The output of the PCM to PWM converter 13 is coupled to the illustrated level shifter 14, bridge 15, and ultimately to a transducer 16, such as a loudspeaker, for example. Reference number 17 illustrates various possible feedback paths for the amplifier 10.

Figure 2:
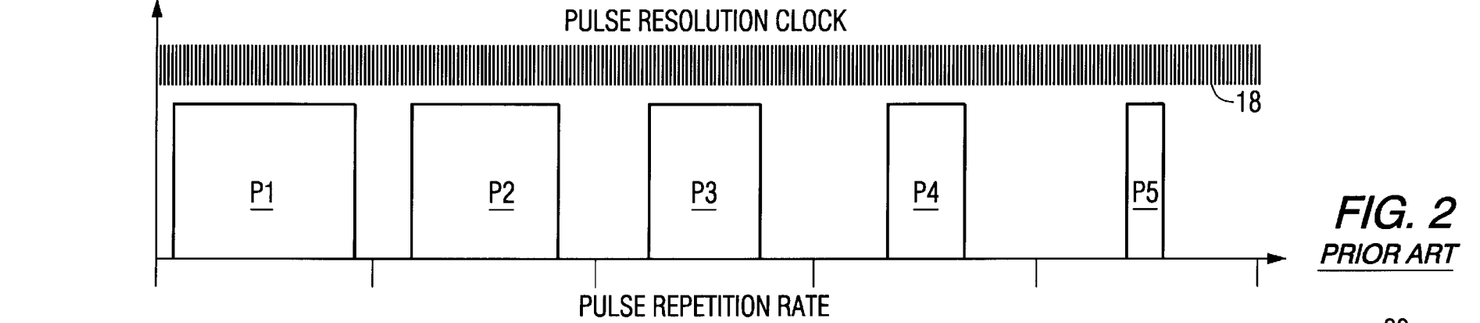
FIG. 2 is a plot of the PWM pulses and the pulse resolution clock signal for the class D amplifier as in the prior art of FIG. 1.

Unfortunately, a significant difficulty occurs in converting the high resolution PCM signal to a corresponding high resolution PWM signal. This is so because as the width of a pulse increases, it's direct current (dc) content increases with a one-to-one relationship. Each individual pulse has a sinc (x) frequency response. If the pulse repetition rate is high enough, then the low pass filter essentially only passes the dc component of each pulse and smooths the transition from one dc level to another as the dc values change as a function of time. Because this system is a sampled time system, the pulse widths are quantized in time as shown in the graphical plots of FIG. 2, where P1–P5 are the illustrated pulses, and the upper plot 18 illustrates the pulse resolution clock edges. This PWM width quantization translates directly into a dc amplitude quantization. There is a practical limitation on the pulse resolution clock 18, the clock that defines the pulse width quantization. This places an inherent limitation on the pulse width resolution which, in turn, limits the total harmonic distortion (THD) of the output signal.

For example, assuming a pulse repetition of 350 KHz, this repetition rate is high enough to support the operating assumption that the low pass filter at the amplifier's output is passing only the near dc signal component, while not being so high as to force a prohibitively high pulse resolution clock for lower resolutions. Higher resolutions are quite different. For example, if it is desired to preserve 16 bits of accuracy through the PCM to PWM conversion, then the pulse repetition clock rate required is 350 KHz times $2^{16}$ or 23 GHz. Such a high required clock rate is impractical.

Figure 3:
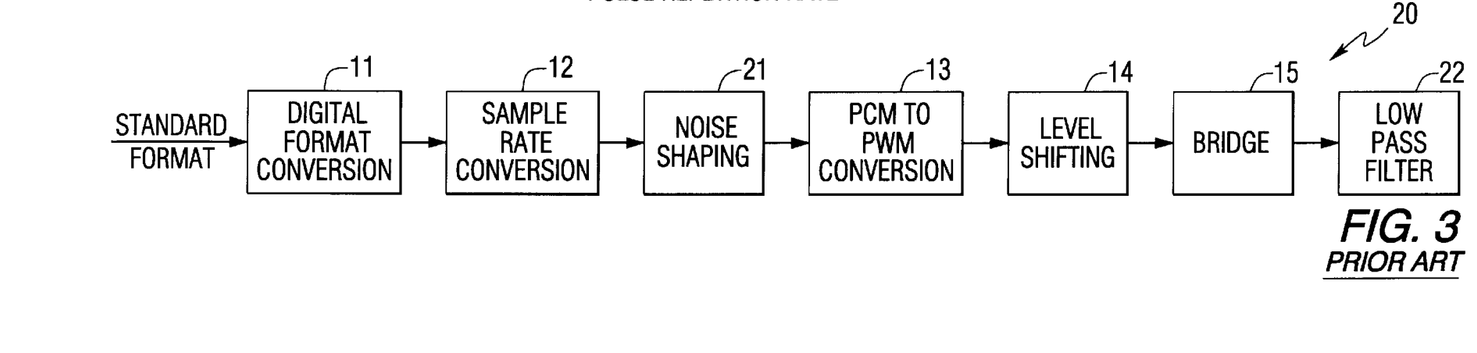
FIG. 3 is a schematic block diagram of a class D amplifier according to the prior art and including a noise shaper.

One prior art approach to overcome this difficulty is to add a noise shaper or filter 21 to the processing chain upstream of the PCM to PWM converter 13 in the circuit 20 as shown in FIG. 3. The noise shaper 21 reduces the required resolution of the PCM signal, and, thus reduces the required time resolution of the subsequent PWM signal. The noise shaper 21 does this by weighting the quantization noise toward the ultimately rejected higher frequencies, and uses the high frequency noise to dither the signal of interest through the low resolution PCM to PWM converter 13. The input signal has an N bit resolution and the output signal has an M bit resolution, where N is greater than M. The ability of the noise shaper 21 to shape the noise is based upon the fact that adjacent input samples are highly correlated. This correlation is assured by the preceding interpolation in the sample rate conversion block 12.

The output signal-to-noise ratio (SNR) can be increased by increasing the degree of oversampling of the input signal, or increasing the order of the noise shaping filter 21. Unfortunately, increasing the degree of oversampling drastically increases overall system complexity, while increasing the noise shaping filter's order beyond three offers diminishing improvement in performance at reasonable oversampling rates. One source of increased system complexity occurs because interpolation filter complexity must be increased.

Another difficulty arises because increasing the oversampling increases the PWM repetition rate. Thus, to keep the same pulse resolutions clock rate, one less bit is allowed in the quantizer for every factor of two that the sampling rate is increased. This may mean that for a third order noise shaping filter, a net noise floor gain of approximately 1.6 bits is realized for every factor of two that the sampling rate is increased, and assuming ideal interpolation.

Yet another difficulty with a conventional noise shaping filter 21 is based upon the dithering noise that must be carried through the PCM to PWM converter 13 to decrease the required PWM timer resolution. This dithering may be later removed by the low pass filter 22. However, there may be perceptible effects in sound quality that result from the dithering.

SUMMARY OF THE INVENTION

In view of the foregoing background, it is therefore an object of the present invention to provide a class D amplifier and associated methods having reduced or eliminated requirements for a noise shaping circuit.

This and other objects, features and advantages according to the invention are provided by a class D amplifier comprising: separating means for separating a pulse code modulation (PCM) signal into a K least significant bits (LSBs) signal and an L most significant bits (MSBs)j signal; a PCM to pulse width modulation (PWM) converter for converting the L MSBs signal into a PWM signal; and LSB processing means for proportionally altering the PWM signal from the PCM to PWM converter based upon the K LSBs signal to define a PWM output control signal More particularly, the PCM input signal may be an N-1 bit PCM magnitude signal. Accordingly the amplifier preferably further includes sign and magnitude extraction means for extracting a sign bit signal arid the N-1 bit magnitude signal from an N bit two's complement PCM input signal. The class D amplifier may also include a switch driver responsive to the extracted sign bit signal and the PWM output control signal, such as to control polarity and on time, respectively.

The PCM to PWM converter may be one of a symmetric PCM to PWM converter; a trailing edge PCM to PWM converter; and a leading edge PCM to PWM converter. Thus, the LSB processing means preferably comprises means for cooperating with the respective type of PCM to PWM converter.

The LSB processing means may comprise a sawtooth wave generator for generating a sawtooth wave signal; a digital-to-analog converter (DAC) for converting a signal related to the K LSBs magnitude signal into an analog signal; and a comparator for generating a threshold signal based upon a comparison of the sawtooth wave signal and the analog signal. The LSB processing means may further comprise logic means for generating the PWM control signal based upon the threshold signal and the PWM signal. In addition, the amplifier may further include a reference clock connected to the sawtooth wave generator, and clock extracting means operatively connected between the sawtooth generator and the PCM to PWM converter for synchronizing conversion.

A method aspect of the invention is for operating a class D amplifier. The method preferably comprises the steps of: separating a pulse code modulation (PCM) signal into a K least significant bits (LSBs) signal and an L most significant bits (MSBs) signal; converting the L MSBs signal into a PWM signal; and proportionally altering the PWM signal based upon the K LSBs signal to define a PWM output control signal. The PCM input signal may be an N-1 bit PCM magnitude signal. Accordingly, the method may further comprise the steps of extracting a sign bit signal and the N-1 bit magnitude signal from an N bit two's complement PCM input signal, and operating a switch driver responsive to the extracted sign bit signal and the PWM output control signal.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 4:
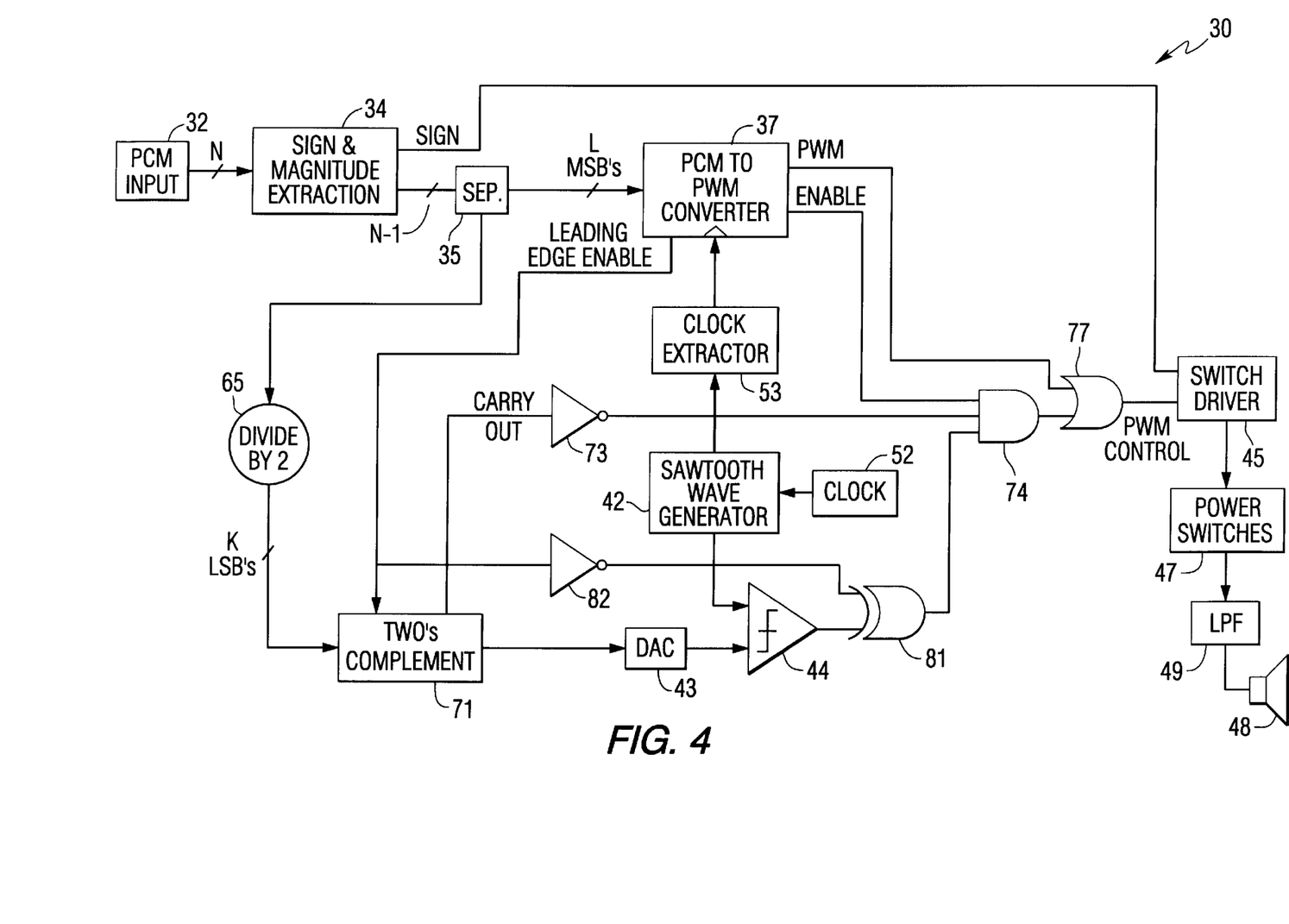
FIG. 4 is a schematic block diagram of one embodiment of a class D amplifier in accordance with the present invention.
Figure 5:
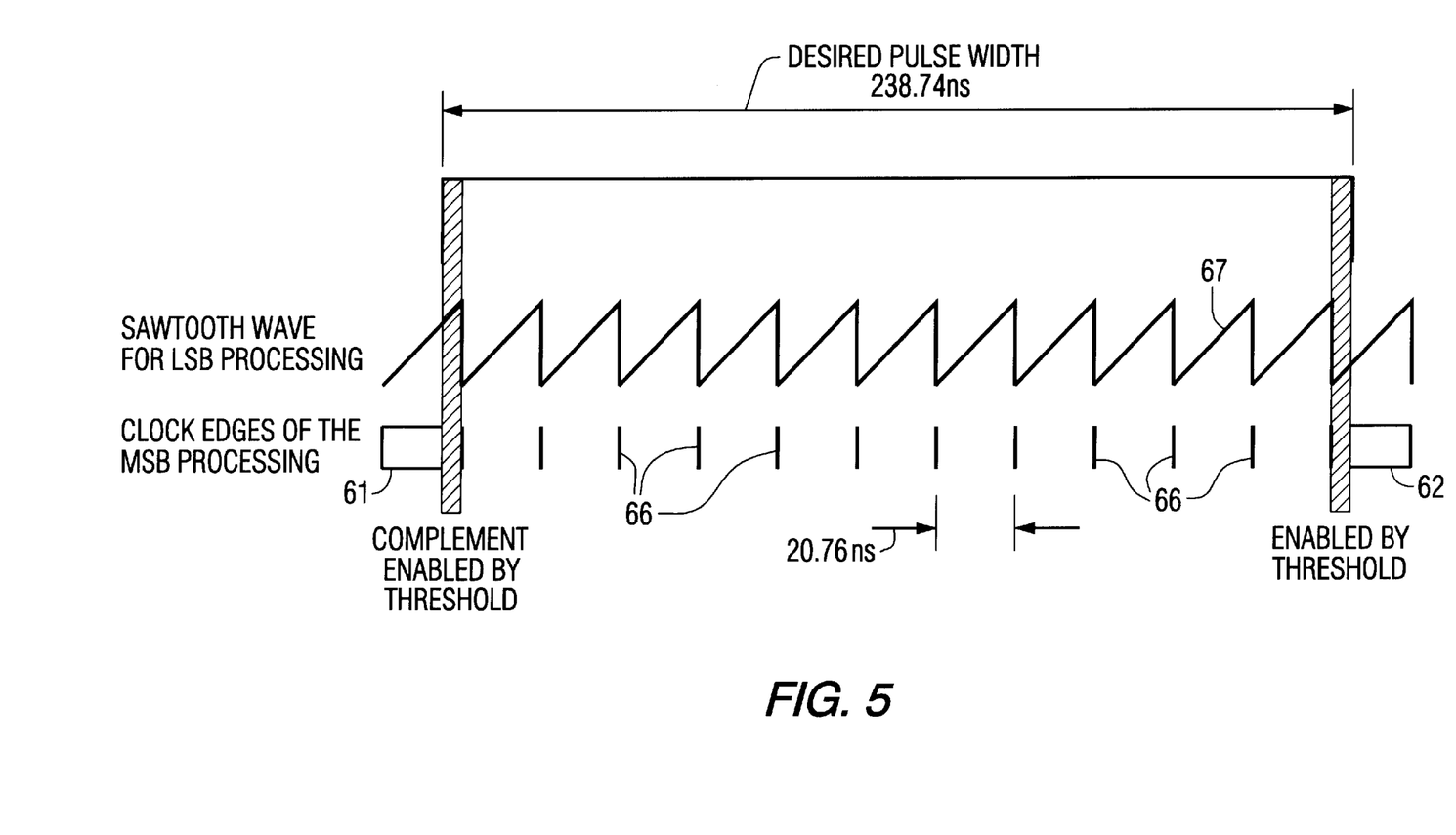
FIG. 5 is a timing diagram of signals produced by the embodiment of the invention shown in FIG. 4.

Turning now Initially to FIGS. 4 and 5, a first embodiment of the class D amplifier 30 according to the invention is described. The amplifier 30 includes input means 32 for producing an N bit, two's complement, PCM signal in the illustrated embodiment as will be readily understood by those skilled in the art. Those of skill in the art will also appreciate that the invention contemplates other than two's complement inputs as well. The first embodiment of the class D amplifier 30 is also configured for symmetric modulation for the purposes of illustration.

The N bit PCM input signal is first illustratively processed by the sign and magnitude extractor 34 which produces a sign bit signal, and an N-1 bit magnitude signal as will also be readily appreciated by those skilled in the art. Downstream from the sign and magnitude extractor 34, separating means 35 is provided for separating an N-1 bit PCM signal into a K least significant bits (LSBs) signal and an L most significant bits (MSBs) signal. The sign bit signal is fed to the switch driver 45 where the final PWM signal interval will be appropriately formatted. The sizes of L and K are determined based upon a tradeoff between the complexity of the circuits used to operate on the two words, as will be appreciated by those skilled in the art.

The class D amplifier 30 also includes the schematically illustrated PCM to PWM converter 37 for converting the L MSBs signal into a PWM signal. As will be readily appreciated by those skilled in the art, the PCM to PWM converter 37 may include one or more counters, dependent on the type of PWM used, preset to an L dependent value clocked by the pulse resolution clock. The counters turn the modulated pulse on or off at predetermined times dependent on L and the pulse repetition rate. In the illustrated embodiment, the counters of the PCM to PWM converter 37 are driven by a clock signal which is synchronous with a sawtooth wave generator 42 used to process the K LSBs word or signal as will be described in greater detail below. The PCM to PWM converter 37 produces a PWM signal.

The amplifier 30 also includes LSB processing means for proportionally altering the PWM signal from the PCM to PWM converter 37 based upon the K LSBs signal to define a PWM output control signal which is input to the illustrated switch driver 45. The switch driver 45 is responsive to the extracted sign bit signal and the PWM output control signal to control polarity and on time, respectively, for the switch driver as will be readily appreciated by those skilled in the art. The switch driver 45 may also be coupled to the schematically illustrated power switches 47 which, in turn, may be coupled to a transducer, such as the illustrated audio speaker 48.

The PCM to PWM converter may be one of a symmetric PCM to PWM converter; a trailing edge PCM to PWM converter; and a leading edge PCM to PWM converter. Thus, the LSB processing means preferably comprises means for cooperating with the respective type of PCM to PWM converter. For the class D amplifier 30 embodiment illustrated with reference to FIGS. 4 and 5, the PCM to PWM converter 37 is a symmetric converter. This illustrated embodiment also assumes trinary output, although those of skill in the art will appreciate that binary operation is also contemplated by the present invention.

In the illustrated embodiment, the LSB processing means comprises a sawtooth wave generator 42 for generating a sawtooth wave signal; a digital-to-analog converter (DAC) 43 for converting a signal related to the K LSBs magnitude signal into an analog signal; and a comparator 44 for generating a threshold signal based upon a comparison of the sawtooth wave signal and the analog signal. The LSB processing means may further comprise logic means for generating the PWM control signal based upon the threshold signal and the PWM signal. In addition, the class D amplifier 30 further includes the illustrated reference clock 52 connected to the sawtooth wave generator 42; and clock extracting means 53 operatively connected between the sawtooth generator and the PCM to PWM converter 37 for synchronizing conversion as will be readily appreciated by those skilled in the art.

For the illustrated embodiment of symmetric PWM, the result of the LSB processing is enabled one clock edge before the onset of a pulse generated by the MSB processing and is disabled one clock edge after a pulse is turned off by the MSB processing. This is illustrated by the blocks 61, 62 in FIG. 5. The figure also shows the sawtooth wave 67 produced by the generator 42. If all of the MSB magnitude bits are zero, for example, the LSB processing circuit is enabled for only two clock periods.

The K LSBs signal of the N-1 PCM signal is used to drive an analog threshold circuit which is used to turn the PWM pulse on and off in the pulse resolution clock time just prior or just after the onset or end of the PCM to PWM converter 37 generated pulse. The actual on and off times are directly proportional to the LSB PCM value as will be readily appreciated by those skilled in the art. Accordingly, the combination of the sign bit, MSB and LSB signal processing chains thus give an accurate N bit PCM to PWM conversion.

The embodiment of the class D amplifier 30 is perhaps better understood with reference to the following example. Assume a pulse repetition rate of 352.8 KHz with a 177 ns dead time ($\frac{1}{16}$ of the pulse repetition period), so that the maximum pulse duration is $\frac{15}{16} \times \frac{1}{352.8}$ KHz=2.657 $\mu$s. Further assume that L is selected to be seven bits, then the pulse resolution clock frequency is 48.16896 MHz and the clock period is 20.76 ns. Assume that the desired pulse width is 238.74 ns or 11.5 clock periods, and assume that the pulse is negative. The input binary value is 1111010010000000. The sign bit is stripped off and sent to the switch driver 45 as previously described. Thus, when the pulse output is off, the class D amplifier's output will be 0 volts, and when the pulse output is turned on, the output will be −V volts. The sign extraction circuit 34 takes the magnitude of the input and sends 0001011 to the PCM to PWM converter 37 and 10000000 to the divider 65.

The divider 65 is used for symmetric PWM because the pulse width contributed by the LSBs needs to be equally divided between the leading and trailing pulse edges. This division call be thought of as schematic only, and may also be implemented by threshold scaling as would be readily appreciated by those skilled in the art.

In the present example, the PCM to PWM converter 37 turns on a pulse for 11 clock counts as indicated by the vertical marks 66 in FIG. 5. It is the task of the LSB processing to generate an output three quarters of the way into the first enabled clock period and to turn off its output one quarter of the way into the last enabled clock as also shown in FIG. 5.

The sawtooth wave 67 used in the illustrated example rises on the leading edge. Because the analog comparator 44 compares a converted version of the K bit PCM signal to a sawtooth wave, and because the smaller the PCM value the earlier the comparator should trigger, the K bit digital word is first two's complemented by the circuit 71. The two's complement output is used during the leading edge enable period only. Because of the special case when all K bits are equal to zero, the two's complement carry out signal Is used to disable the output of the comparator 44 via the illustrated inverter 73 and AND gate 74. In other words, the if a K bit value of zero is received, then the LSB processing circuit should not activate. However, the K bit two's complement value of zero is zero and the circuit would trigger at the beginning of the clock signal cycle, thus the need for the disable signal.

During the trailing edge enable period, the output of the comparator 44 is inverted to compensate for the leading edge rise on the sawtooth wave 67. This is perhaps best understood with further reference to FIG. 5, where the sawtooth wave 67 is seen to be below the threshold of the comparator during the period when the LSBs processing circuit needs to enable the trailing part of the output pulse. This also accounts for the case when the LSBs are equal to zero. Of course, those of skill in the art can readily appreciate other equivalent alternatives to the sawtooth waveform and comparator operation as described.

The output of the two's complement circuit 71, whether enabled (complementing) or disabled (pass through) is passed to a low resolution DAC 43 where the PCM signal is converted to an analog format. The output of the DAC 43 may require some degree of filtering to smooth the output signal as will be readily appreciated by those skilled in the art. Such an output filter would not be used for signal reconstruction, but for signal accuracy so that it would not have the same constraints as the typical DAC anti-imaging filter.

The analog signal is fed to the comparator 44 where it is compared to a linearly increasing waveform 67 in this illustrated embodiment. When one input is greater than or equal to the other signal, then an output signal is generated. The leading edge enable signal from the PCM to PWM converter 37 is also coupled to the exclusive OR gate 81 via the illustrated inverter 82. The exclusive OR gate 81 also receives as an input, the output of the comparator 44.

As will be readily appreciated by those skilled in the art, the combination of the DAC 43, comparator 44, and sawtooth waveform generator 42 described herein could be replaced with any device/circuit that generates an output signal delayed from a time reference, where the delay is linearly proportional to the input digital value.

Once the output of the comparator 44 is gated by the enabling signals described above, it is ORed with the output of the PCM to PWM converter 37 in the illustrated OR gate 77 to form the desired final pulse width. It is assumed that the two input signals to the OR gate 77 are synchronized by the clock extraction circuit 53. The switch driver 45 translates the PWM signal into a format compatible with the actual power switches 47. As also illustrated, the power switches 47 may be coupled to a transducer, such as the illustrated loudspeaker 48 via the illustrated low pass filter 49 as will be readily appreciated by those skilled in the prior art.

Figure 6:
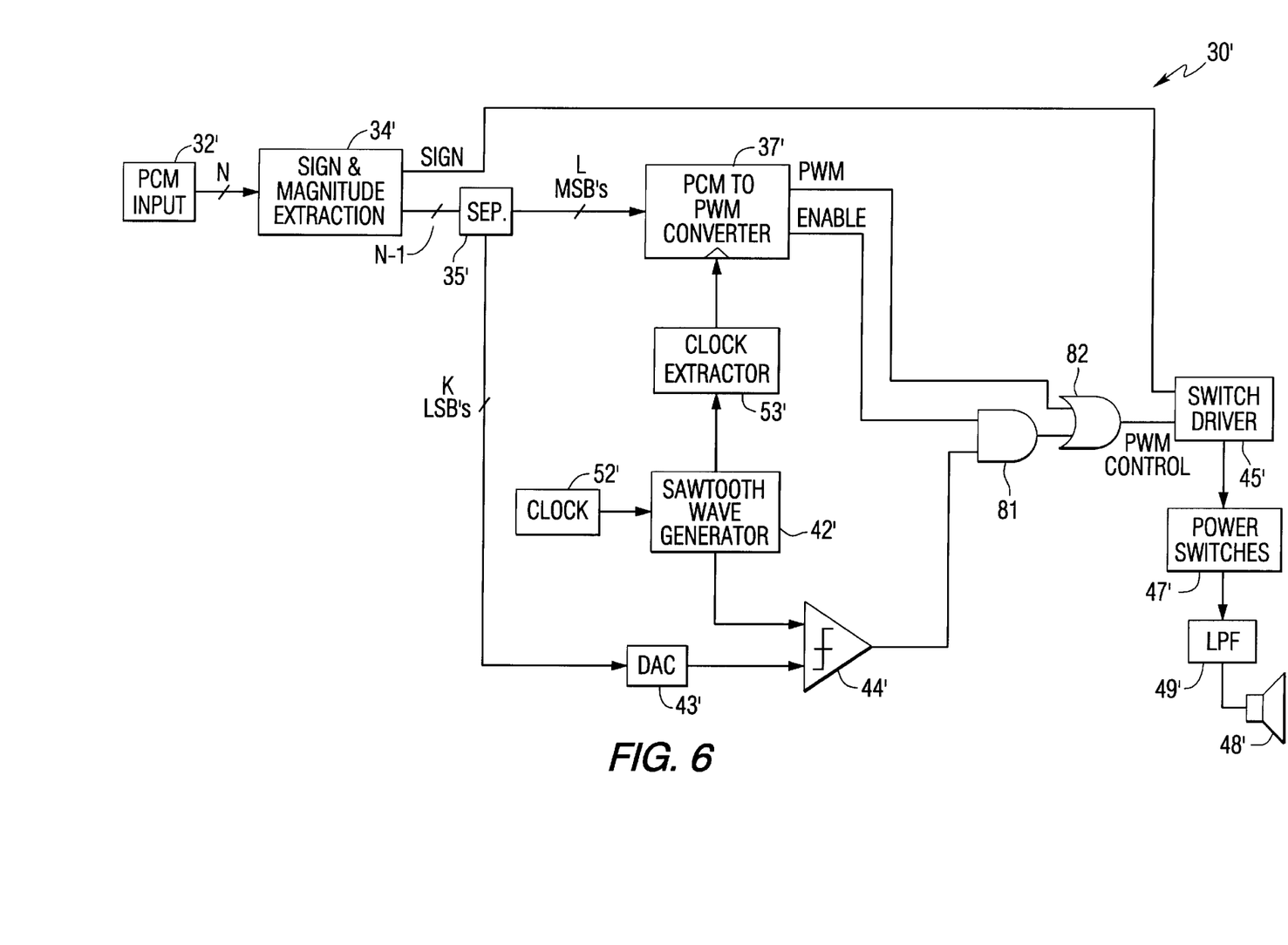
FIG. 6 is a schematic block diagram of another embodiment of a class D amplifier in accordance with the present invention.
Figure 7:
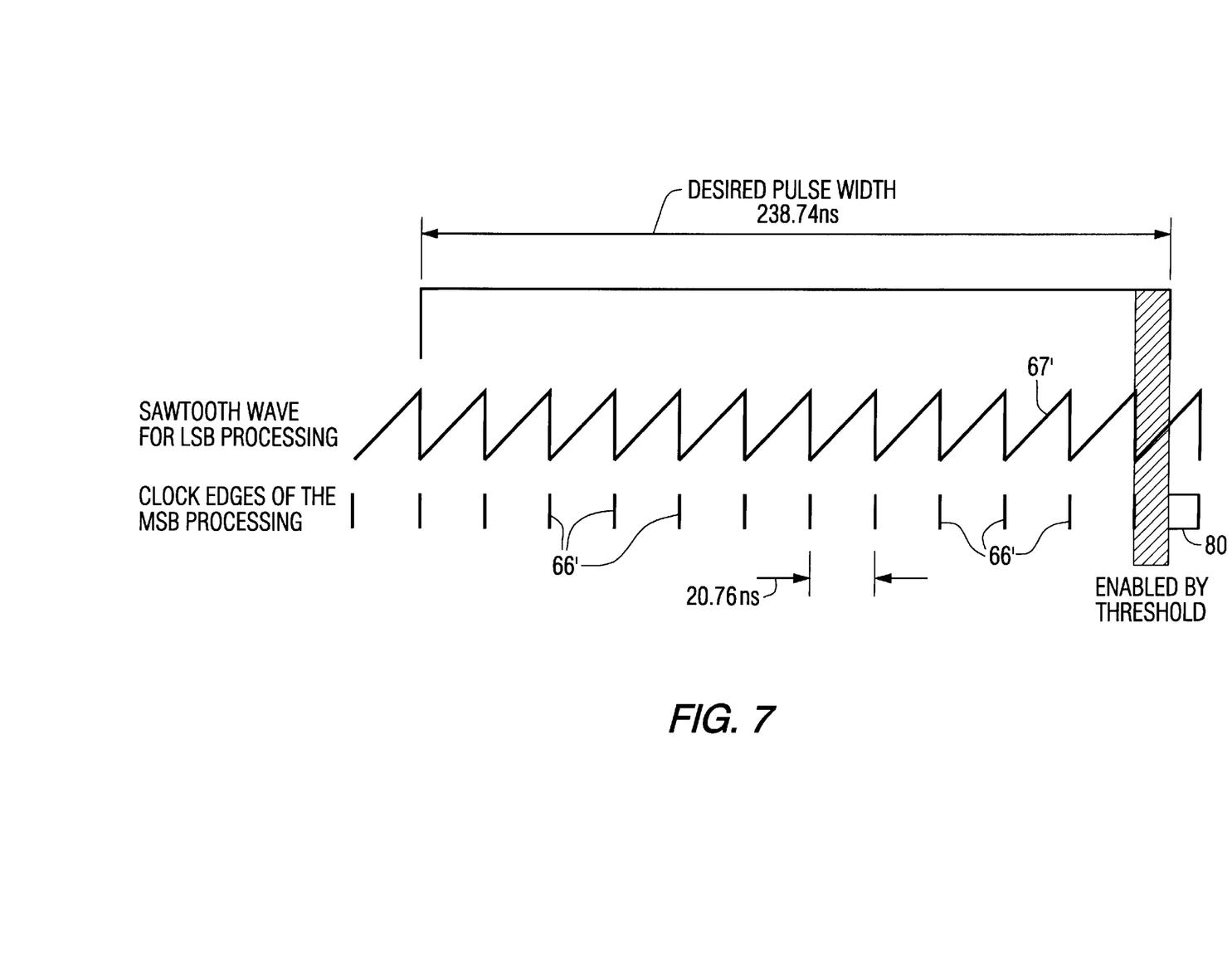
FIG. 7 is a timing diagram of signals produced by the embodiment of the invention shown in FIG. 6.

Turning now to FIGS. 6 and 7, a second embodiment of the class D amplifier 30' in accordance with the present invention is now described. This embodiment includes similar components as those described above and as indicated with prime notation. This embodiment is a representation also directed to a two's complement input. This embodiment of the class D amplifier 30' also assumes trailing edge modulation and trinary pulses as will be readily appreciated by those skilled in the art.

An N bit two's complement PCM signal is fed to the sign and magnitude extraction circuit 34'. The sign is fed to the switch driver 45'. The magnitude output is an N−1 bit magnitude value which is then divided or separated by the separator circuit 35' into an L bit MSB word and a K bit LSB word. The selection of L and K may be made based, upon a consideration of the tradeoff between circuit complexity in the various portions of the class D amplifier 30'.

The truncated PCM magnitude value L is fed to an L bit PCM to PWM converter 37'. The counters of the converter 37' are driven by a clock which is synchronous with a wave generator used to process the LSB word as illustrated in the timing diagram of FIG. 7. For the illustrated embodiment, trailing edge PWM is used so that the result of the LSB processing is disabled one clock edge after a pulse is turned off by the MSB processing. This is perhaps best understood with reference to the block 80 in FIG. 7. If all of the MSB magnitude bits are zero, the LSB processing circuit is enabled for only one clock period.

As described above, the K LSBs signal of the N−1 bit PCM magnitude is used to drive the analog threshold circuit which, in turn, is used to turn the PWM pulse off in the pulse resolution clock period just after the end of the pulse generated by the PCM to PWM converter 37'. The actual off time is directly proportional to the LSB PCM value. In summary, the combination of the sign bit, MSB and LSB signal processing chains thus give an accurate N bit PCM to PWM conversion.

Turning to a practical example, assuming a pulse repetition rate of 352.8 KHz with a 177 ns dead time ($\frac{1}{16}$ of the pulse repetition period), the maximum pulse duration is $\frac{15}{16} \times \frac{1}{352.8}$ KHz=2.657 $\mu$s. If it is further assumed that L is selected as seven, then the pulse resolution clock frequency is 48.16896 MHz and the clock period is 20.76 ns.

Further assume that the desired pulse width is 238.74 ns or 11.5 clock periods and assume that the pulse is positive. The input binary value is 0000101110000000. The sign bit is stripped off and sent to the switch driver 45'. Thus, when the pulse output is off, the class D amplifier's output will be 0 volts, and when the pulse output is turned on, the amplifier's output will be V volts. The sign and magnitude extractor 34' and separator 35' sends 0001011 to the PWM to PCM converter 37' and 10000000 to the DAC 43' in the LSB processing circuit portion. The output of the DAC 43' may benefit from some degree of filtering to smooth the output signal as described above and as would be readily understood by those skilled in the art.

The analog signal is fed to the comparator 44' where it is compared to a linearly increasing waveform as shown in FIG. 7. When the input from the DAC 43' is greater than or equal to the sawtooth waveform 67', then an output signal is generated. The combination of the DAC 43', comparator 44', and sawtooth wave generator 42' could be replaced with an equivalent circuit that generates an output signal delayed from a time reference, and where the delay is linearly proportional to the input digital value.

In the case of the illustrated embodiment and example, the PCM to PWM converter 37' turns on a pulse for 11 clock counts, and enables the LSB processing circuit output one clock edge after those 11 clock periods. The LSB processing generates an output half of the way into the first enabled clock time, and turns off its output as shown in FIG. 7.

Once the output of the comparator 44' is gated by the enabling signals described above via the AND gate 81, it is ORed in the OR gate 82 with the output of the PCM to PWM converter 37' to form the desired final pulse width. It is assumed that the two input signals to the OR gate 82 are synchronized by the clock extraction circuitry. The resulting signal is fed to the switch driver 45'. Those elements noted with a prime and not specifically described with reference to FIG. 6, have been fully described above with reference to FIG. 4, and, hence, these elements need no further description.

Figure 8:
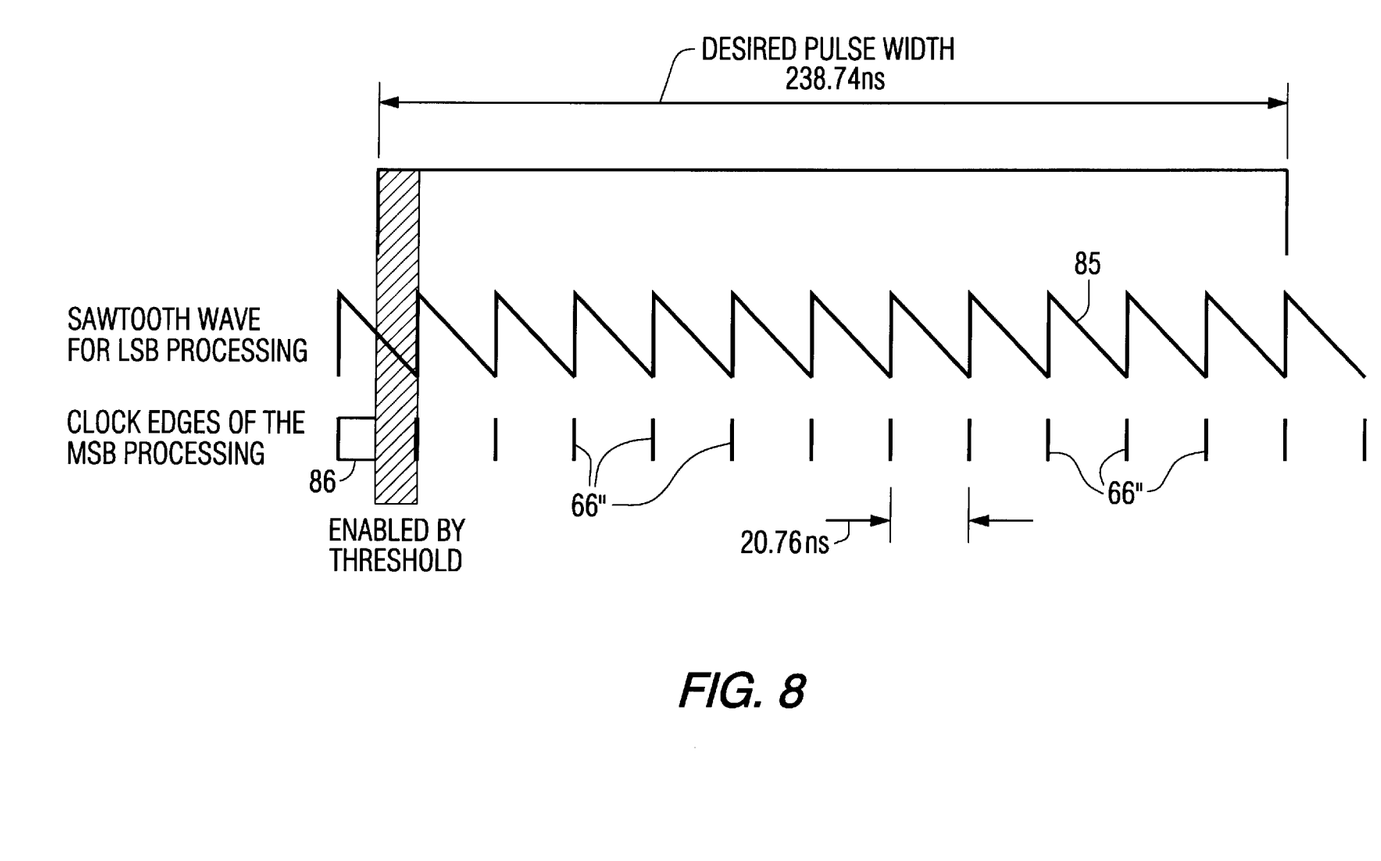
FIG. 8 is a timing diagram of signals produced by a variation of the embodiment of the invention shown in FIG. 6.

Turning additionally to the timing diagram of FIG. 8, another embodiment of the class D amplifier 30" is now explained. This embodiment is directed to leading edge modulation. The circuit may be readily implemented using a circuit similar to that shown in FIG. 6; however, for leading edge modulation, the sawtooth wave generator generates a sawtooth wave 85 that decreases from the leading edge as shown in FIG. 8. In this embodiment, the LSB processing circuit is enabled one clock cycle before the PCM to PWM converted 37' triggers the onset of a pulse. The LSB enable area is shown by the box 86 in FIG. 8. As can be readily determined from FIG. 8, the LSB circuit fires when the voltage output of the DAC 43' is greater than the corresponding portion of the sawtooth wave 85. Of course those skilled in the art will appreciate other equivalent circuits for adapting for leading edge modulation.

A method aspect of the invention is for operating a class D amplifier. The method preferably comprises the steps of: separating a pulse code modulation (PCM) signal into a K least significant bits (LSBs) signal and an L most significant bits (MSBs) signal; converting the L MSBs signal into a PWM signal; and proportionally altering the PWM signal based upon the K LSBs signal to define a PWM output control signal. The PCM input signal may be an N−1 bit PCM magnitude signal. Accordingly, the method may further comprise the steps of extracting a sign bit signal and the N−1 bit magnitude signal from an N bit two's complement PCM input signal, and operating a switch driver responsive to the extracted sign bit signal and the PWM output control signal.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A class D amplifier comprising:

input means for receiving an N bit two's complement pulse code modulation (PCM) input signal;

sign and magnitude extraction means for extracting a sign bit signal and an N−1 bit magnitude signal from the N bit two's complement PCM input signal;

separating means for separating the N−1 bit magnitude signal into a K least significant bits (LSBs) signal and an L most significant bits (MSBs) signal;

a PCM to pulse width modulation (PWM) converter for converting the L MSBs signal into a PWM signal;

LSB processing means for proportionally altering the PWM signal from said PCM to PWM converter based upon the K LSBs signal to define a PWM output control signal; and a switch driver responsive to the extracted sign bit signal and the PWM output control signal.

2. A class D amplifier according to claim 1 wherein said PCM to PWM converter is a symmetric PCM to PWM converter; and wherein said LSB processing means comprises means for cooperating with said symmetric PCM to PWM converter.

3. A class D amplifier according to claim 1 wherein said PCM to PWM converter is a trailing edge PCM to PWM converter; and wherein said LSB processing means comprises means for cooperating with said trailing edge PCM to PWM converter.

4. A class D amplifier according to claim 1 wherein said PCM to PWM converter is a leading edge PCM to PWM converter; and wherein said LSB processing means comprises means for cooperating with said leading edge PCM to PWM converter.

5. A class D amplifier according to claim 1 wherein said LSB processing means comprises:
 a sawtooth wave generator for generating a sawtooth wave signal;
 a digital-to-analog converter (DAC) for converting a signal related to the K LSBs signal into an analog signal; and
 a comparator for generating a threshold signal based upon a comparison of the sawtooth wave signal and the analog signal.

6. A class D amplifier according to claim 5 wherein said LSB processing means further comprises logic means for generating the PWM output control signal based upon the threshold signal and the PWM signal.

7. A class D amplifier according to claim 5 wherein said logic means comprises an "OR" gate.

8. A class D amplifier according to claim 5 further comprising:
 a reference clock connected to said sawtooth wave generator; and
 clock extracting means operatively connected between said sawtooth generator and said PCM to PWM converter for synchronizing conversion thereof.

9. A class D amplifier according to claim 6 wherein said PCM to PWM converter includes first enable means for generating a first enable signal for use by said logic means.

10. A class D amplifier according to claim 6 wherein said LSB processing means further comprises:
 divide by two means for dividing the K LSBs magnitude signal by two; and
 two's complement means connected between said divide by two means and said DAC.

11. A class D amplifier according to claim 10 wherein said two's complement means has a carry output, and wherein said logic means comprises a first inverter connected to the carry output.

12. A class D amplifier according to claim 10 wherein said PCM to PWM converter comprises enable means for generating a second enable signal coupled to said two's complement means and to said logic means.

13. A class D amplifier according to claim 12 wherein said logic means comprises a second inverter receiving the second enable signal.

14. A class D amplifier according to claim 1 wherein said switch driver has a controllable polarity responsive to the extracted sign bit signal.

15. A class D amplifier according to claim 1 wherein said switch driver has an on time responsive to the PWM output control signal.

16. A class D amplifier according to claim 1 further comprising at least one power switch connected to said switch driver.

17. A class D amplifier comprising:
 separating means for separating a pulse code modulation (PCM) signal into a K least significant bits (LSBs) signal and an L most significant bits (MSBs) signal, the PCM input signal comprising an N−1 bit PCM magnitude signal;
 a PCM to pulse width modulation (PWM) converter for converting the L MSBs signal into a PWM signal;
 LSB processing means for proportionally altering the PWM signal from said PCM to PWM converter based upon the K LSBs signal to define a PWM output control signal;
 sign and magnitude extraction means for extracting a sign bit signal and the N−1 bit magnitude signal from an N bit two's complement PCM input signal; and
 a switch driver responsive to the PWM output control signal.

18. A class D amplifier according to claim 17 wherein the switch driver is also responsive to the extracted sign bit signal.

19. A class D amplifier according to claim 18 wherein said switch driver has a controllable polarity responsive to the extracted sign bit signal; and wherein said switch driver has an on time responsive to the PWM output control signal.

20. A class D amplifier according to claim 17 wherein said PCM to PWM converter is a symmetric PCM to PWM converter; and wherein said LSB processing means comprises means for cooperating with said symmetric PCM to PWM converter.

21. A class D amplifier according to claim 17 wherein said PCM to PWM converter is a trailing edge PCM to PWM converter; and wherein said LSB processing means comprises means for cooperating with said trailing edge PCM to PWM converter.

22. A class D amplifier according to claim 17 wherein said PCM to PWM converter is a leading edge PCM to PWM converter; and wherein said LSB processing means comprises means for cooperating with said leading edge PCM to PWM converter.

23. A class D amplifier comprising:
 separating means for separating a pulse code modulation (PCM) signal into a K least significant bits (LSBs) signal and an L most significant bits (MSBs) signal;
 a PCM to pulse width modulation (PWM) converter for converting the L MSBs signal into a PWM signal; and
 LSB processing means for proportionally altering the PWM signal from said PCM to PWM converter based upon the K LSBs signal to define a PWM output control signal, said LSB processing means comprising
 a sawtooth wave generator for generating a sawtooth wave signal;
 a digital-to-analog converter (DAC) for converting a signal related to the K LSBs signal into an analog signal; and
 a comparator for generating a threshold signal based upon a comparison of the sawtooth wave signal and the analog signal.

24. A class D amplifier according to claim 23 wherein said LSB processing means further comprises logic means for generating the PWM output control signal based upon the threshold signal and the PWM signal.

25. A class D amplifier according to claim 24 further comprising:
 a reference clock connected to said sawtooth wave generator; and
 clock extracting means operatively connected between said sawtooth generator and said PCM to PWM converter for synchronizing conversion thereof.

26. A class D amplifier comprising:
 sign and magnitude extraction means for extracting a sign bit signal and an N−1 bit magnitude signal from an N bit two's complement PCM input signal;
 separating means for separating the N−1 bit magnitude signal into a K least significant bits (LSBs) signal and an L most significant bits (MSBs) signal;
 a PCM to pulse width modulation (PWM) converter for converting the L MSBs signal into a PWM signal;
 LSB processing means for proportionally altering the PWM signal from said PCM to PWM converter based upon the K LSBs signal to define a PWM output control signal, said LSB processing means comprising
a sawtooth wave generator for generating a sawtooth wave signal,
a digital-to-analog converter (DAC) for converting a signal related to the K LSBs signal into an analog signal,
a comparator for generating a threshold signal based upon a comparison of the sawtooth wave signal and the analog signal,
logic means for generating the PWM output control signal based upon the threshold signal and the PWM signal, and
clock extracting means operatively connected between said sawtooth generator and said PCM to PWM converter for synchronizing conversion thereof; and
a switch driver responsive to the extracted sign bit signal and the PWM output control signal.

27. A class D amplifier according to claim 26 wherein said PCM to PWM converter is a symmetric PCM to PWM converter; and wherein said LSB processing means comprises means for cooperating with said symmetric PCM to PWM converter.

28. A class D amplifier according to claim 26 wherein said PCM to PWM converter is a trailing edge PCM to PWM converter; and wherein said LSB processing means comprises means for cooperating with said trailing edge PCM to PWM converter.

29. A class D amplifier according to claim 26 wherein said PCM to PWM converter is a leading edge PCM to PWM converter; and wherein said LSB processing means comprises means for cooperating with said leading edge PCM to PWM converter.

30. A class D amplifier according to claim 26 wherein said switch driver has a controllable polarity responsive to the extracted sign bit signal; and wherein said switch driver has an on time responsive to the PWM output control signal.

31. A method for operating a class D amplifier comprising the steps of:
separating a pulse code modulation (PCM) signal into a K least significant bits (LSBs) signal and an L most significant bits (MSBs) signal, the PCM input signal comprising an N−1 bit PCM magnitude signal;
converting the L MSBs signal into a PWM signal;
proportionally altering the PWM signal based upon the K LSBs signal to define a PWM output control signal;
extracting a sign bit signal and the N−1 bit magnitude signal from an N bit two's complement PCM input signal; and
operating a switch driver responsive to the PWM output control signal.

32. A method according to claim 31 wherein the switch driver is also responsive to the extracted sign bit signal.

33. A method according to claim 31 wherein the converter step comprises symmetrically converting the L MSBs signal into the PWM signal.

34. A method according to claim 31 wherein the converter step comprises converting using trailing edge conversion.

35. A method according to claim 31 wherein the converter step comprises converting using leading edge conversion.

* * * * *

UNITED STATES PATENT AND TRADEMARK OFFICE
CERTIFICATE OF CORRECTION

PATENT NO. : 6,014,055
DATED : January 11, 2000
INVENTOR(S) : David B. Chester

It is certified that error appears in the above-identified patent and that said Letters Patent is hereby corrected as shown below:

| | |
|---|---|
| Column 2, Line 46 | Strike "j" after (MSBs) |
| Column 2, Line 51 | Add - -.- - after "signal" and before "More" |
| Column 3, Line 64 | Strike: "Initially" <br> Insert: - -initially- - |
| Column 5, Line 64 | Strike: "Is" <br> Insert: - -is- - |
| Column 6, Line 67 | Strike: "," after "based" |
| Column 8, Line 10 | Strike: "converted" <br> Insert: - -converter- - |

Signed and Sealed this

Seventeenth Day of October, 2000

Attest:

Q. TODD DICKINSON

*Attesting Officer*   *Director of Patents and Trademarks*